United States Patent [19]
Davis et al.

[11] Patent Number: 5,535,165
[45] Date of Patent: Jul. 9, 1996

[54] CIRCUITS, SYSTEMS AND METHODS FOR TESTING INTEGRATED CIRCUIT DEVICES INCLUDING LOGIC AND MEMORY CIRCUITRY

[75] Inventors: Phillip D. Davis, Lewisville; Sudhir Sharma, Plano; Hai Long, Dallas, all of Tex.

[73] Assignee: Cirrus Logic, Inc., Fremont, Calif.

[21] Appl. No.: 497,267

[22] Filed: Jun. 30, 1995

[51] Int. Cl.$^6$ .............................. G11C 7/00; G11C 29/00; G01R 31/28

[52] U.S. Cl. ..................... 365/201; 365/189.05; 365/198; 371/21.1; 371/22.1

[58] Field of Search .................... 365/201, 198, 365/189.05; 371/21.1, 22.1

[56] References Cited

U.S. PATENT DOCUMENTS

| | | | |
|---|---|---|---|
| 4,672,583 | 6/1987 | Nakaizumi | 365/201 |
| 4,956,518 | 9/1990 | Hatayama et al. | 365/201 |
| 5,047,711 | 9/1991 | Smith et al. | 324/158 |
| 5,134,587 | 7/1992 | Steele | 365/201 |
| 5,383,193 | 1/1995 | Pazhak et al. | 371/21.4 |
| 5,414,352 | 5/1995 | Tanase | 324/158.1 |

Primary Examiner—David C. Nelms
Assistant Examiner—Trong Phan
Attorney, Agent, or Firm—Winstead Sechrest & Minick

[57] ABSTRACT

A single chip integrated circuit 200 is disclosed which includes logic circuitry 202, memory circuitry 204, and a bus 300. First bus control circuitry 302 controls the exchange of signals between logic circuitry 202 and bus 300. Second bus control circuitry 303 controls the exchange of signals between memory circuitry 204 and bus 300. Third bus control circuitry 306 is included which controls the exchange of signals between bus 300 and at least one test pin 206. Mode control circuitry 205 is operable as control circuitry 302, 303, and 306. In the operating mode, mode control circuitry 205 activates first bus control circuitry 302 and second bus control circuitry 303. In a memory test mode, mode control circuitry 205 activates second bus control circuitry 303 and third bus control circuitry 306 and deactivates first bus control circuitry 302. In a logic test mode, test mode circuitry 205 activates first bus control circuitry 302 and third bus control circuitry 306 and deactivates second bus control circuitry 303.

23 Claims, 1 Drawing Sheet

CIRCUITS, SYSTEMS AND METHODS FOR TESTING INTEGRATED CIRCUIT DEVICES INCLUDING LOGIC AND MEMORY CIRCUITRY

TECHNICAL FIELD OF THE INVENTION

The present invention relates in general to the testing of integrated circuits and in particular circuits, systems and methods for testing single chip integrated circuit devices including both logic and memory circuitry.

Testing is critically important during both the development and production phases of an integrated circuit. During development, a given integrated circuit must be tested to verify that the circuit design and fabrication process meet the designer's target performance parameters. During production, testing is typically used to eliminate defective chips and/or verify process integrity as devices are fabricated in quantity. As more complex integrated circuit designs are implemented and more functions are made available on single chip devices, testing becomes more critical to successful commercialization.

One instance where particular attention must be paid to testing methodology is when memory and logic circuitry are being integrated on a single chip. While it is desirable to test both the logic and memory circuit blocks together to verify full device operation, normally independent testing of each block is also required. Among other things, in order to adequately test the logic circuitry using the on-chip memory, representative memory access operations must normally be performed. In this case memory operation must first be verified (or if some risk is accepted, simply assumed to be proper). On the other hand, in order to adequately test the memory using the on-chip logic circuitry, proper operation of the logic circuitry must first be verified.

Notwithstanding, current testing practices often dictate that independent testing of circuit blocks be performed. Specifically, different methodologies (philosophies) are normally used to test memory circuits, logic circuits, and memory-logic interfaces. Currently, no single method is available which is capable of efficiently and completely testing each type of circuit block, as well as the interface between those blocks in a single test procedure. This problem is compounded by the fact that different methodologies most often require the use of different test apparatus.

Given the need for independent testing of the memory and logic blocks in an integrated memory-logic chip, the goal becomes one of independently accessing each such block so that the testing can be performed. In achieving this goal, the need to test the operation of the entire integrated device must also be factored in.

In sum, circuits, systems and methods are required which allow an integrated memory-logic chip to be tested in at three different ways: first, as a memory device; second, as a logic device; and third, as an integrated memory and logic device.

SUMMARY OF THE INVENTION

According to the principles of the present invention, the logic and memory portions of an integrated circuit can be independently tested. In general, a plurality of bus drivers (transceivers) are provided to control the interface between the logic circuitry and the memory circuitry. Additional bus drivers (transceivers) are provided which allow the interface circuitry to be monitored by an external testing device through a series of test pins. During the normal operating mode, the transceivers allow logic and memory circuitry to communicate in a conventional fashion. In a memory test mode, the transceivers isolate the logic circuitry and allow the memory circuitry to be accessed by external testing apparatus through the test pins. In the logic circuitry test mode, the transceivers isolate the memory circuitry and allow the logic circuitry to communicate with external test apparatus through the test pins.

According to a first embodiment of the present invention, a single chip integrated circuit is provided which includes logic circuitry, memory circuitry, and a bus. First bus control circuitry is provided for controlling the exchange of signals between the logic circuitry and the bus. Second bus control circuitry is provided for controlling the exchange of signals between the memory circuitry and the bus. Further, third bus control circuitry is included for controlling the exchange of signals between the bus and at least one test pin. Mode control circuitry controls the first, second, and third bus control circuits. In an operating mode, the mode control circuitry activates the first and second bus control circuitry. In a memory test mode, the mode control circuitry activates the second and third bus control circuitry and deactivates the first bus control circuitry. Finally, in a logic test mode, the mode control circuitry activates the first and third bus control circuits and deactivate the second bus control circuitry.

According to a second embodiment of the principles of the present invention, an integrated logic and memory circuit is disposed on a single chip. A data bus is provided for exchanging data between the logic circuitry and the memory circuitry. A first transceiver is included for controlling the exchange of data between the logic circuitry and the data bus while a second transceiver is included for controlling the exchange of data between the memory circuitry and the data bus. A third transceiver controls the exchange of data between the data bus and at least one test pin. A control bus is also included for exchanging control signals between the logic circuitry and the memory circuitry. A buffer is provided for driving signals generated by the logic circuitry onto the control bus. A fourth transceiver controls the exchange of signals between the control bus and at least one other test pin. Mode control circuitry selectively activates and deactivates the transceivers and the buffer.

According to a third embodiment of the present invention, an integrated display control device is disposed on a single chip which includes a display controller, frame buffer, and a bus. First bus control circuitry is included for controlling the exchange of signals between the controller and the bus. Second bus control circuitry controls the exchange of signals between the frame buffer and the bus. Additionally, third bus control circuitry is provided for controlling the exchange of signals between the bus and a plurality of test pins. The first, second and third bus control circuits are controlled by on-chip mode control circuitry. In an operating mode, the mode control circuitry activates the first and second bus control circuits. In a frame buffer test mode, the mode control circuitry activates the second and third bus control circuits and deactivates the first bus control circuit. Finally, in a control test mode, the mode control circuitry activates the first and third bus control circuit and deactivates the second bus control circuitry.

The principles of the present invention are also embodied in methods for testing a single chip integrated circuit including logic circuitry, memory circuitry, and a bus. The method includes the step of independently testing the memory circuitry. First bus control circuitry is activated to couple the memory circuitry to an internal bus. Second bus control circuitry is deactivated to isolate the logic circuitry from the internal bus while third bus control circuitry is activated to couple the internal bus to at least one test pin. The method further includes the step of independently testing the logic circuitry. The second bus control circuitry is activated to couple the logic circuitry to the internal bus. The first bus control circuitry is deactivated to isolate the memory circuitry from the internal bus. Additionally, the third bus control circuitry is activated to couple the internal bus to the at least one test pin.

The principles of the present invention provide substantial advantages over the prior art. Among other things, an integrated circuit which includes blocks of both logic and memory circuitry can be completely tested. Specifically, the operation memory and logic circuit blocks can each be independently tested, as well as the operation of the entire integrated circuit, including the interface between the logic and memory circuit blocks. Advantageously, since the memory and logic blocks can be independently tested, the methodologies and test apparatus suitable for each can be employed. Further, since each block can be independently tested, if one block is fully operational and the other is not, the integrated circuit can still be packaged and sold as a single function device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of to present invention, and the advantages thereof, reference is now made to the following descriptions taken in conjunction with the accompanying drawings, in which.

DETAILED DESCRIPTION OF THE INVENTION

Figure 1:
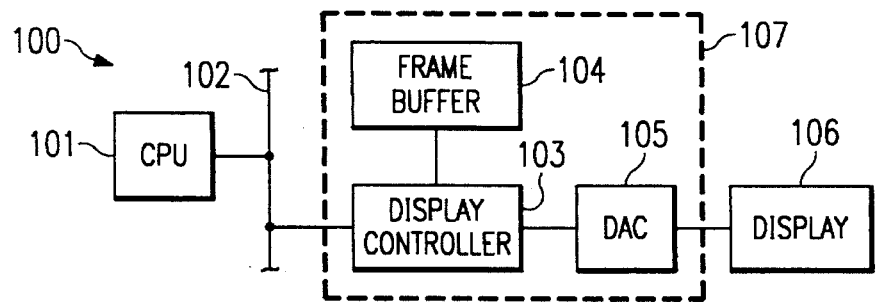
FIG. 1 is a high level functional block diagram of an integrated display controller and frame buffer device, the device of FIG. 1 being an exemplary application of the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an IA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE Spectrum) which directly accepts digital data. It should also be noted that in alternate embodiments, "display" 106 may be another type of output device such as a laser printer or similar document view/print appliances.

Figure 2:
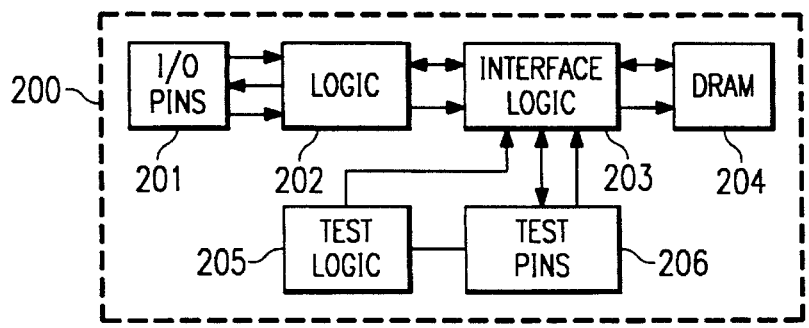
FIG. 2 is a functional block diagram of an integrated circuit with integrated logic and memory circuit blocks and embodying the principles of the present invention.

FIG. 2 is a functional block diagram of a logic-memory integrated circuit device 200. Device 200 includes input/output pins 201, logic 202, interface logic 203, a DRAM memory 204, test logic 205, and test pins 206. In one embodiment, device 200 comprises integrated frame buffer—display controller 107, although in alternate embodiments device 200 could represent other types of single chip devices with both a memory and logic circuitry.

Input/output pins 201 provide an interface to device 200 for the exchange of data and control signals with external circuitry and devices. In the exemplary system of FIG. 1, input/output pins 201 implement the interconnect between display controller 103 and system bus 102, with logic 202 being display controller 103. Alternatively, logic 202 comprises random logic, a state machine, or another type of controller or microprocessor.

Interface logic 203 controls the flow of control signals and data between logic 202 and DRAM 204. Interface logic 203 operates in conjunction with test logic 205 and 206; a more detailed description of this operation is provided below in conjunction with FIGURE 3.

Integrated circuit 200 is illustrated with a dynamic random access memory (DRAM) integrated with logic 202. DRAM 204 could be replaced in alternate embodiments of circuit 200 with another type of memory, such as a static random access memory (SRAM). In integrated display controller—frame buffer 107, DRAM 204 comprises frame buffer 104.

Figure 3:
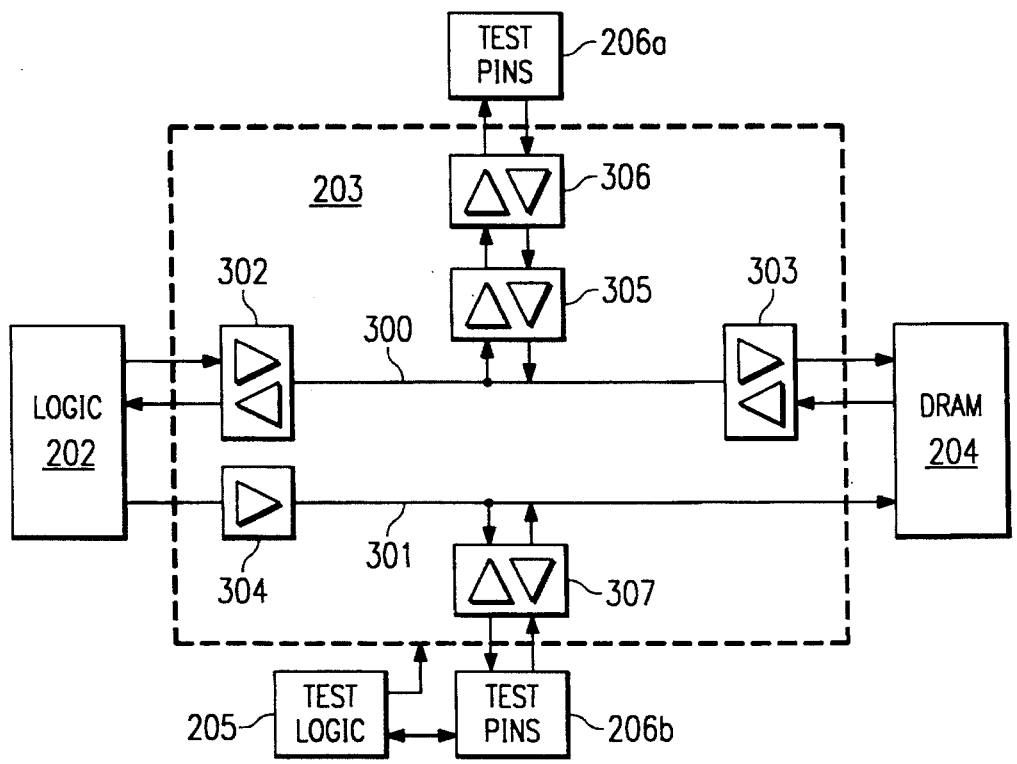
FIG. 3 is a more detailed functional block diagram of the test and interface logic blocks depicted in FIG. 2.

FIG. 3 is a more detailed functional block diagram emphasizing the subcircuits of interface circuitry 203, according to the principles of the present invention. Interface circuitry 203 includes two primary buses: a bidirectional data bus 300 for exchanging data between logic 202 and DRAM 204; and, a unidirectional control bus 301 for transmitting addresses and control signals from logic 202 to DRAM 204. Data transmission and reception on data bus 300 is controlled by a pair of bidirectional transceivers 302 and 303. Data is driven on control bus 301 by a tri-statable buffer 304.

Data is exchanged between to the data test pins 206a and data bus 300 through bidirectional transceivers 305 and 306.

It should be noted that transceiver 305 is optional; transceiver 305 may be included to drive the capacitive loading of the lines coupling bus 300 and transceiver 306, and of transceiver 306 itself. An additional bidirectional transceiver 307 controls the exchange of control signals between control signal test pins 206b and control bus 301.

Integrated circuit 200 operates in one of three primary modes under the control of test logic (mode control circuitry) 205. In the normal mode, logic 202 and DRAM 204 operate in conjunction with each other to affect the desired function of entire circuit 200. For example, in the display controller—frame buffer embodiment of FIG. 1, display data (video or graphics) are generated in this mode, as directed by CPU 101, for generating display on display 106.

In the DRAM test mode, logic circuitry 202 is isolated such that tests can be performed on DRAM 204 by an external tester, such as a memory tester, coupled to test pins 206. By isolating logic circuitry 202, logic circuitry neither affects, or is affected by, the testing of DRAM 204.

In the logic test mode, DRAM 204 is isolated such that test can be performed on logic 202, by a tester coupled to test pins 206. With DRAM 204, tests on logic circuitry 202 are neither affected by nor affect, DRAM 204.

Additionally, circuit 200 can be placed in a test mode but in a normal configuration (both logic and DRAM available) or a monitor mode where circuit 200 is in a normal configuration but may be monitored through the test pins.

Test logic 205 controls mode selection. In the preferred embodiment, a test mode enable pin (ENABLE) and two test mode select pins (SEL1 and SEL2) are provided as part of test pins 206. An active enable signal on the enable test pin places circuit 200 in test mode and signals on the mode select pins determine which test mode is implemented. When the test enable pin receives an inactive signal, circuit 200 is in a normal mode. A summary of the modes is provided in Table I:

and 301. Transceivers 305, 306, and 307 are turned off. If any or all of test pins 206 are shared, those pins are switched to connect to their normal operating mode circuits. During a normal mode with monitoring, transceivers 306, 305, and 307 are switched to output only allowing passive monitoring of the normal operation of circuit 200.

In the DRAM test mode, transceiver 302 and buffer 301 are in the high impedance state. Bus 300 is coupled to DRAM 204 through active transceiver 303. Test data is introduced to data bus 300 through test pins 206a and active transceivers 305 and/or 306. Test addresses and control signals to DRAM 204 are introduced through active transceiver 307 and test pins 206b.

In the logic test mode, transceiver 303 is turned off (in the high impedance state). Transceiver 302 and buffer 304 are turned-on. Test data can be exchanged with logic 202 through bus 300 and active transceivers 305 and/or 306. DRAM addresses and control signals output from logic 202 can be monitored on test pins 206b through bus 301 and activated transceiver 307.

During a test mode with normal configuration (full test mode), transceivers 302 and 303 and buffer 304 are active and transceivers 305, 306, and 307 are turned-off (unless test pins are available and monitoring is desired). In this case, the normal input/output pins 201 are used to input test vectors and read back test results for full configuration testing.

The principles of the present invention have the further advantage of improving yield. For example, if complete testing of the individual logic and memory blocks reveals that one such block is fully operational while the other is not, the chip (die) can still be packaged and sold as a single function device.

Although the present invention and its advantages have been described in detail, it should be understood that various changes, substitutions and alterations can be made herein without departing from the spirit and scope of the invention as defined by the appended claims.

| | TEST LOGIC INPUTS | | | TEST CONFIGURATION | | |
|---|---|---|---|---|---|---|
| MODE | ENABLE | SEL1 | SEL2 | LOGIC | DRAM | TEST PINS |
| NORMAL | 0 | X | X | ON | ON | OFF |
| TEST MODE-FULL | 1 | 0 | 0 | ON | ON | OFF |
| DRAM TEST | 1 | 0 | 1 | OFF | ON | OFF |
| LOGIC TEST | 1 | 1 | 0 | ON | OFF | ON |
| NORMAL-MONITOR | 1 | 1 | 1 | ON | ON | OUTPUT ONLY |

Where "X" means "don't care," "on" means isolated and/or non-operational and "off" means coupled to the corresponding bus and operational.

Test pins 206 may be either dedicated or shared pins. For example, the mode select pins may be used for other functions when an inactive signal is received at the test mode enable pin (i.e. during the normal operating mode). Other test pins, such as those required to input test vectors, test data, test addresses, test control signals, etc., may similarly be shared with the pins required for normal operation. Shared pins decrease pin count. Dedicated pins reduce the complexity of test logic and provide for the extra feature of being able to monitor the logic-DRAM internal interface during either the test or normal modes.

In the normal mode, transceivers 302 and 303, and buffer 304 are active such that data, addresses and control signals can be transmitted across both data and control buses 300

What is claimed is:

1. A single chip integrated circuit comprising:

logic circuitry;

memory circuitry;

a bus;

first bus control circuitry for controlling the exchange of signals between said logic circuitry and said bus;

second bus control circuitry for controlling the exchange of signals between said memory circuitry and said bus;

third bus control circuitry for controlling the exchange of signals between said bus and at least one test pin; and mode control circuitry operable to:

in an operating mode, activate said first and second bus control circuitry;

in a memory test mode, activate said second and third bus control circuitry and deactivate said first bus control circuitry; and in a logic test mode, activate said first and third bus control circuitry and deactivate said second bus control circuitry.

2. The integrated circuit of claim 1 wherein said mode control circuitry is further operable in a monitor mode to activate said first, second and third bus control circuitry.

3. The integrated circuit of claim 2 wherein said integrated circuit further comprises:

a second bus;

fourth bus control circuitry for controlling the exchange of signals between said logic circuitry and said second bus;

fifth bus control circuitry for controlling the exchange of signals between said second bus and a second plurality of test pins; and wherein said mode control circuitry is further operable in said operating and logic test modes to activate said fourth and fifth bus control circuitry and in said memory test mode, deactivate said fourth bus control circuitry.

4. The integrated circuit of claim 1 wherein said first, second and third bus control circuitry each comprise transceiver circuitry.

5. The integrated circuit of claim 3 wherein said fourth bus control circuitry comprises a tri-statable buffer.

6. The integrated circuit of claim 3 wherein said mode control circuitry is further operable to activate said fifth bus control circuitry in said monitor mode.

7. An integrated logic and memory circuit disposed on a single chip comprising:

a data bus for exchanging data between said logic circuitry and said memory circuitry;

a first transceiver for exchanging data between said logic circuitry and said data bus;

a second transceiver for exchanging data between said memory circuitry and said data bus;

a third transceiver for exchanging data between said data bus and at least one test pin;

a control bus for exchanging control signals between said logic circuitry and said memory circuitry;

a buffer for driving signals generated by said logic circuitry onto said control bus; and a fourth transceiver for exchanging signals between said control bus and at least one other test pin; and mode control circuitry for selectively activating and deactivating said transceivers and said buffer.

8. The circuit of claim 7 wherein said mode control circuitry is operable to:

in an operating mode, activate said first and second transceivers and said buffer;

in a memory test mode, activate said second, third and fourth bus transceivers and deactivate said first transceiver and said buffer; and in a logic test mode, activate said first, third, and fourth transceivers and said buffer and deactivate said second transceiver.

9. The circuit of claim 7 wherein said logic circuitry comprises a state machine.

10. The circuit of claim 7 wherein said logic circuitry comprises random logic.

11. The circuit of claim 7 wherein said logic circuitry comprises a controller.

12. The circuit of claim 7 wherein said logic circuitry comprises a microprocessor.

13. The circuit of claim 7 wherein said memory comprises a dynamic random access memory.

14. The circuitry of claim 7 wherein said mode control circuitry operates in response to a test mode enable signals and at least one mode select signal.

15. An integrated display control device disposed on a single chip comprising:

a display controller;

a frame buffer;

a bus;

first bus control circuitry for controlling the exchange of signals between said controller and said bus;

second bus control circuitry for controlling the exchange of signals between said frame buffer and said bus;

third bus control circuitry for controlling the exchange of signals between said bus and a plurality of test pins; and mode control circuitry operable to:

in an operating mode, activate said first and second bus control circuitry;

in a frame buffer test mode, activate said second and third bus control circuitry and deactivate said first bus control circuitry; and in a controller test mode, activate said first and third bus control circuitry and deactivate said second bus control circuitry.

16. The device of claim 15 wherein said bus comprises a data bus.

17. The device of claim 16 and further comprising:

a control bus;

a buffer for transmitting control signals from said display controller to said frame buffer via said second bus; and transceiver circuitry for exchanging signals between said second bus and a second plurality of test pins.

18. The device of claim 17 wherein said mode control circuitry is further operable to:

in said operating mode, activate said buffer;

in said frame buffer test mode, deactivate said buffer and activate said transceiver; and in said controller test mode, activate said buffer and said transceiver.

19. The device of claim 17 wherein said frame buffer comprises a dynamic random access memory.

20. The device of claim 17 and further comprising a digital to analog converter disposed on said chip for coupling said device to a display unit.

21. A method of testing a single chip integrated circuit including logic circuitry, memory circuitry, and a bus, comprising the steps of:

independently testing the memory circuitry, said step of testing the memory circuitry comprising the substeps of:

activating first bus control circuitry to couple the memory circuitry to an internal bus;

deactivating second bus control circuitry to isolate the logic circuitry from the internal bus; and activating third bus control circuitry to couple the internal bus to at least one test pin; and independently testing the logic circuitry, said step of testing the logic circuitry comprising the substeps of:

activating the second bus control circuitry to couple the logic circuitry to the internal bus;

deactivating the first bus control circuitry to isolate the memory circuitry from the internal bus; and activating the third bus control circuitry to couple the internal bus to the at least one test pin.

22. The method of claim 21 wherein said step of testing the memory circuitry further comprises the substeps of:

deactivating fourth bus control circuitry to isolate the logic circuitry from a second internal bus coupled to said memory circuitry; and activating fifth bus control circuitry to couple the second internal bus to at least one other test pin.

23. The method of claim 21 wherein said step of testing the logic circuitry further comprises the substeps of:

activating fourth bus control circuitry to couple the logic circuitry to a second internal bus; and activating fifth bus control circuitry to couple the second internal bus to at least one other test pin.

* * * * *